United States Patent [19]

Hennig

[11] Patent Number: 5,514,995
[45] Date of Patent: May 7, 1996

[54] PCMCIA POWER INTERFACE

[75] Inventor: Bruce Hennig, San Jose, Calif.

[73] Assignee: Micrel, Inc., San Jose, Calif.

[21] Appl. No.: 380,162

[22] Filed: Jan. 30, 1995

[51] Int. Cl.[6] ............................................. H03K 17/687
[52] U.S. Cl. ...................... 327/399; 327/170; 327/333; 327/381; 327/389; 327/391; 327/546; 327/427
[58] Field of Search ..................... 307/126, 141, 307/141.4, 141.8; 327/170, 264, 288, 399, 427, 433, 545, 546, 564, 319, 333, 381, 389, 391

[56] References Cited

U.S. PATENT DOCUMENTS

| | | | |
|---|---|---|---|
| 3,889,133 | 6/1975 | Oka et al. | 327/434 |
| 4,093,875 | 6/1978 | Knepper | 327/434 |
| 4,269,496 | 5/1981 | Motoori et al. | 327/398 |
| 4,603,269 | 7/1986 | Hochstein | 327/434 |
| 4,644,182 | 2/1987 | Kawashima et al. | 327/288 |
| 4,775,801 | 10/1988 | Baum | 327/343 |
| 5,047,675 | 9/1991 | Cerato et al. | 327/434 |
| 5,281,870 | 1/1994 | Kobatake | 327/170 |
| 5,317,206 | 5/1994 | Hanibuchi et al. | 327/170 |
| 5,334,882 | 8/1994 | Ting | 327/170 |

OTHER PUBLICATIONS

IBM Technical Disclosure Bulletin, Hanafi, "Delay Driver Circuit", pp. 3610–3611.
"Host CPU's IC Manages Power for PCMCIA Cards", by Frank Goodenough, *Electronic Design*, Sep. 5, 1994, pp. 47–52.

*Primary Examiner*—Terry Cunningham
*Attorney, Agent, or Firm*—Skjerven, Morrill, MacPherson, Franklin & Friel; William L. Paradice, III

[57] ABSTRACT

An improved power interface device suitable for managing power for a PCMCIA card is disclosed which includes internal charge pumps, to gradually turn on the device's internal N-channel MOSFETs, and a first discharge circuit for gradually turning off the N-channel MOSFETs. The first discharge circuit includes an MOS capacitor that incrementally discharges the gates of the N-channel MOSFETs such that the turn-off speed of each N-channel MOSFET is controlled by the ratio of the capacitances of the capacitor and the MOSFET's gate. A second discharge circuit includes a capacitor and is used to gradually turn on the interface device's internal P-channel MOSFET by incrementally charging its gate. The turn-on speed of the P-channel MOSFET is controlled by the ratio of the capacitances of this capacitor and the MOSFET's gate. In another embodiment, diode clamps are provided to protect the interface device's N-channel MOSFETs against time dependent breakdown. The diode clamps are formed within the substrate housing the device's internal charge pumps, thereby saving valuable die area.

4 Claims, 5 Drawing Sheets

PCMCIA POWER INTERFACE

FIELD OF THE INVENTION

This invention relates to power management applications. More particularly, this invention relates to a power interface device which manages power for PCMCIA cards.

BACKGROUND

The PCMCIA card has found its way into virtually every computer related application ranging from flash memories to handheld medical equipment. The PCMCIA card may be plugged into a host device, such as a portable computer, with a standard 68-pin connector. In a typical PCMCIA system, the host device contains 3.3, 5, and 12 volt power supplies, a PCMCIA controller, and a PCMCIA power interface device. The PCMCIA controller polls the PCMCIA card via an I/O bus to determine which voltages the card requires at its $V_{pp}$ and $V_{cc}$ pins and transmits this information to the power interface device via a control bus. In response thereto, the power interface device provides the requested voltages to the PCMCIA card at the $V_{pp}$ and $V_{cc}$ pins. The operating voltages are provided at the $V_{cc}$ pin while the read, write, and erase voltages are provided at the $V_{pp}$ pin. In accordance with PCMCIA standards, the power interface device must selectively distribute voltages of 0, 3.3, and 5 volts to the $V_{cc}$ pins and 0, 3.3, 5.0, and 12 volts to the $V_{pp}$ pins.

The PCMCIA convention requires that the power interface device utilizes high-side switching, i.e., all loads are hard wired to ground and the on/off state of each load is controlled with a switch connected between the load's supply inputs and an external DC power source. For low current applications, a P-channel device may be used as the switch. Due to the relatively high on-resistance of P-channel devices as compared to that of N-channel devices, however, high current applications require a N-channel switch. An inherently slow charge pump circuit capable of bringing the gate of the N-channel switch approximately 10 volts or more above its source is normally used to turn on the N-channel switches.

Accordingly, PCMCIA power interface devices generally include N-channel power MOSFET switches for managing the distribution of voltages to the $V_{cc}$ and $V_{pp}$ pins. These MOSFET switches should be turned on gradually to prevent undesirable current spikes which, if not minimized, may pull down the host device's power supply and cause indeterminate states in the interface device's logic. Nonetheless, unless care is taken, conventional interface devices experience some current spikes during switching-of the $V_{cc}$ line, e.g., switching the $V_{cc}$ pin from 5 volts to 3.3 volts.

Furthermore, conventional interface devices suffer from breakdown. Although the gate oxide of power MOSFET switches will typically rupture only at high voltages, these MOSFETs may experience degraded performance if subjected to lower voltages for an extended period of time. This phenomenon, sometimes referred to as time dependent breakdown, may cause long term reliability problems in power interface devices.

SUMMARY

An improved power interface device suitable for managing power for a PCMCIA card is disclosed which has numerous advantages over the prior art. A power interface device in accordance with the present invention includes N-channel power MOSFETs for providing 3.3 and 5 volts to the $V_{cc}$ and $V_{pp}$ pins. Internal charge pumps are employed to gradually turn these N-channel MOSFETs on and off. Since current requirements are much smaller for the 12 V supply than for either of the 3.3 and 5 V supplies, a P-channel power MOSFET is used to manage the 12 volt power supply delivered to the $V_{pp}$ pin. Rather than using a charge pump circuit, an enhancement circuit which includes an MOS capacitor gradually turns on the P-channel MOSFET. The turn-on speed of the P-channel MOSFET is determined by the ratio of the capacitances of the MOS capacitor and the gate of the P-channel MOSFET. This feature is advantageous since it allows for very accurate control of the P-channel MOSFET's turn-on speed, even over wide temperature ranges. Further, since the turn-on speed is proportional to the MOS capacitor's area divided by the gate capacitance area, the turn-on speed of the P-channel MOSFET may be desirably decreased while simultaneously reducing the die area of the discharge circuit. Therefore, undesirable current spikes attributable to turning on the P-channel MOSFET switch are reduced while simultaneously reducing the size of the MOS capacitor.

The gates of the N-channel MOSFET switches which manage power delivered to the $V_{cc}$ pins are coupled to a discharge circuit having an MOS discharge capacitor. This discharge circuit gradually discharges the gates of these N-channel MOSFET switches and thus gradually turns off the N-channel MOSFET switches. The gradual turning off of these switches further reduces undesirable current spikes which occur during $V_{cc}$ switching transitions. As described above, the turn-off speed of the $V_{cc}$ MOSFET switches is advantageously controlled by a ratio of like capacitances. This feature allows the turn-off speeds of the $V_{cc}$ switches to be easily and accurately controlled over a wide range of temperatures. In the preferred embodiment, the enhancement circuit used to gradually turn on the P-channel MOSFET is identical to the discharge circuit used to gradually turn off the N-channel MOSFETs.

In another embodiment in accordance with the present invention, diode clamps are provided to protect the interface device's internal N-channel power MOSFET switches against time dependent breakdown. The diode clamps are formed within the substrate of the N-channel MOSFETs, thereby saving valuable die area.

DETAILED DESCRIPTION OF THE PREFERRED EMBODIMENTS

Figure 1:
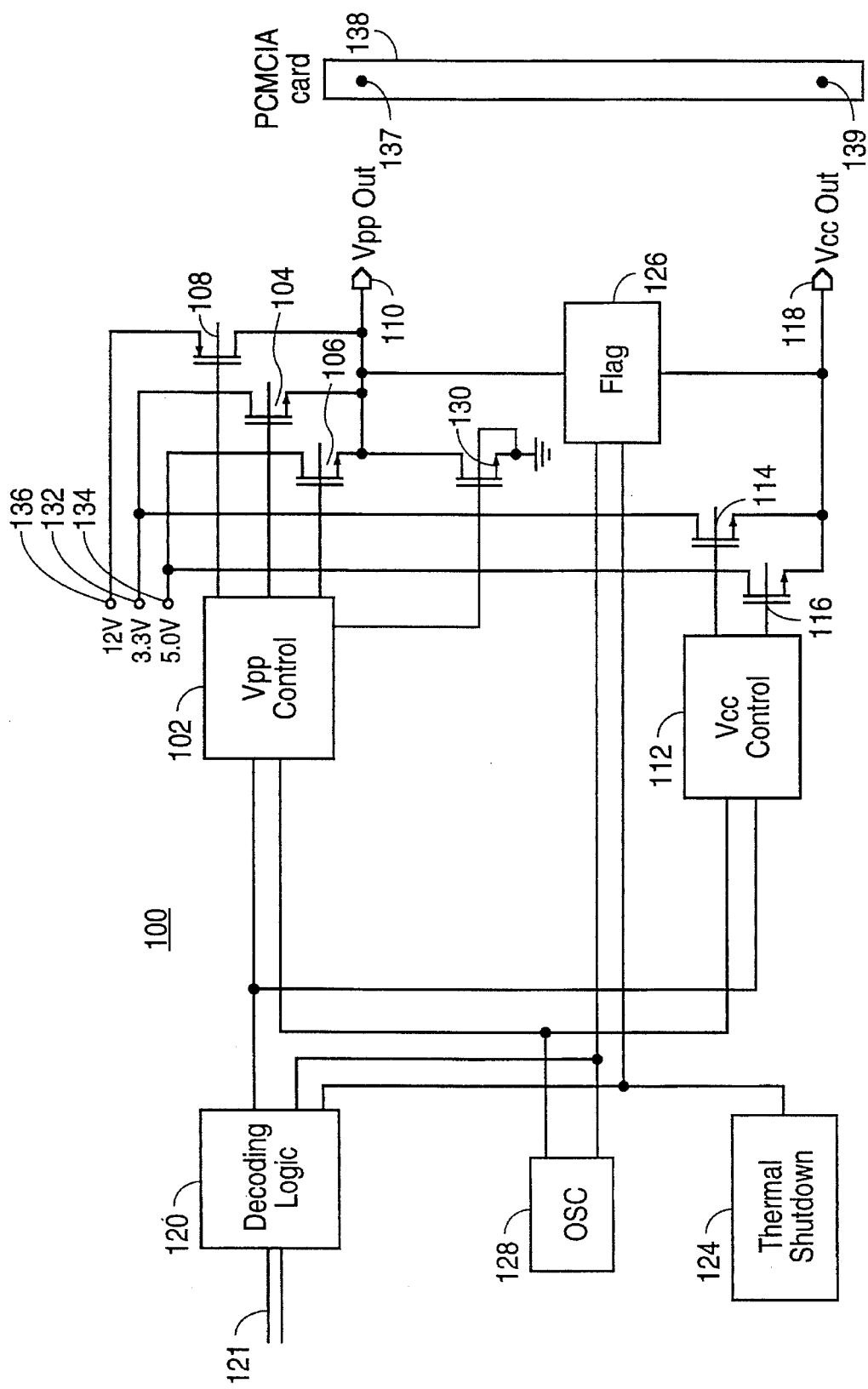
FIG. 1 is a block diagram of a PCMCIA power interface device in accordance with the present invention.

FIG. 1 is a block diagram of a PCMCIA power interface device 100 in accordance with the present invention. One or more power supplies (not shown) deliver 3.3, 5, and 12 volt power to device 100 at terminals 132, 134, and 136, respectively.

Device 100 includes $V_{pp}$ control 102 which controls the on and off states of $V_{pp}$ switches 104, 106 and 108 for selectively delivering power at either 3.3, 5, or 12 volts, respectively, to $V_{pp}$ pin 110. $V_{cc}$ control 112 controls the on and off states of $V_{cc}$ switches 114 and 116 for selectively delivering power at either 3.3 or 5 volts, respectively, to $V_{cc}$ pin 118. Switch 130 is coupled to $V_{pp}$ pin 110 and, in response to a control signal from $V_{pp}$ control 102, pulls $V_{pp}$ pin 110 to ground potential. $V_{pp}$ pin 110 provides the erase, read and write programming voltages to terminal 137 of PCMCIA card 138, while $V_{cc}$ pin 118 provides the operating voltages to terminal 139 of PCMCIA card 138. The PCMCIA card 138 also contains data, address, and control terminals which are conventional and not shown for simplicity.

Decoding logic circuit 120 is a conventional contact mask programmable logic circuit and is coupled to both $V_{pp}$ control 102 and $V_{cc}$ control 112. A conventional PCMCIA controller (not shown) polls the PCMCIA card 138 to determine which voltages card 138 requires at its $V_{pp}$ and $V_{cc}$ terminals. This information is transmitted to logic circuit 120 via control bus 121 and, in response thereto, logic circuit 120 directs $V_{pp}$ control 102 and $V_{cc}$ control 112 to provide the appropriate voltages at $V_{pp}$ pin 110 and $V_{cc}$ pin 118 via switches 104, 106, 108 and switches 114 and 116, respectively.

A thermal shutdown circuit 124 may be coupled to logic circuit 120 and to output flag 126 to force device 100 to cease operating when device 100 reaches a temperature of approximately 160 degrees Celsius. Such a thermal shutdown circuit is well known in the art and will not be discussed herein.

An internal oscillator 128 is coupled to and drives both $V_{pp}$ control 102 and $V_{cc}$ control 112. Oscillator 128 produces a square wave having a frequency of approximately 100 kHz.

Figure 2:
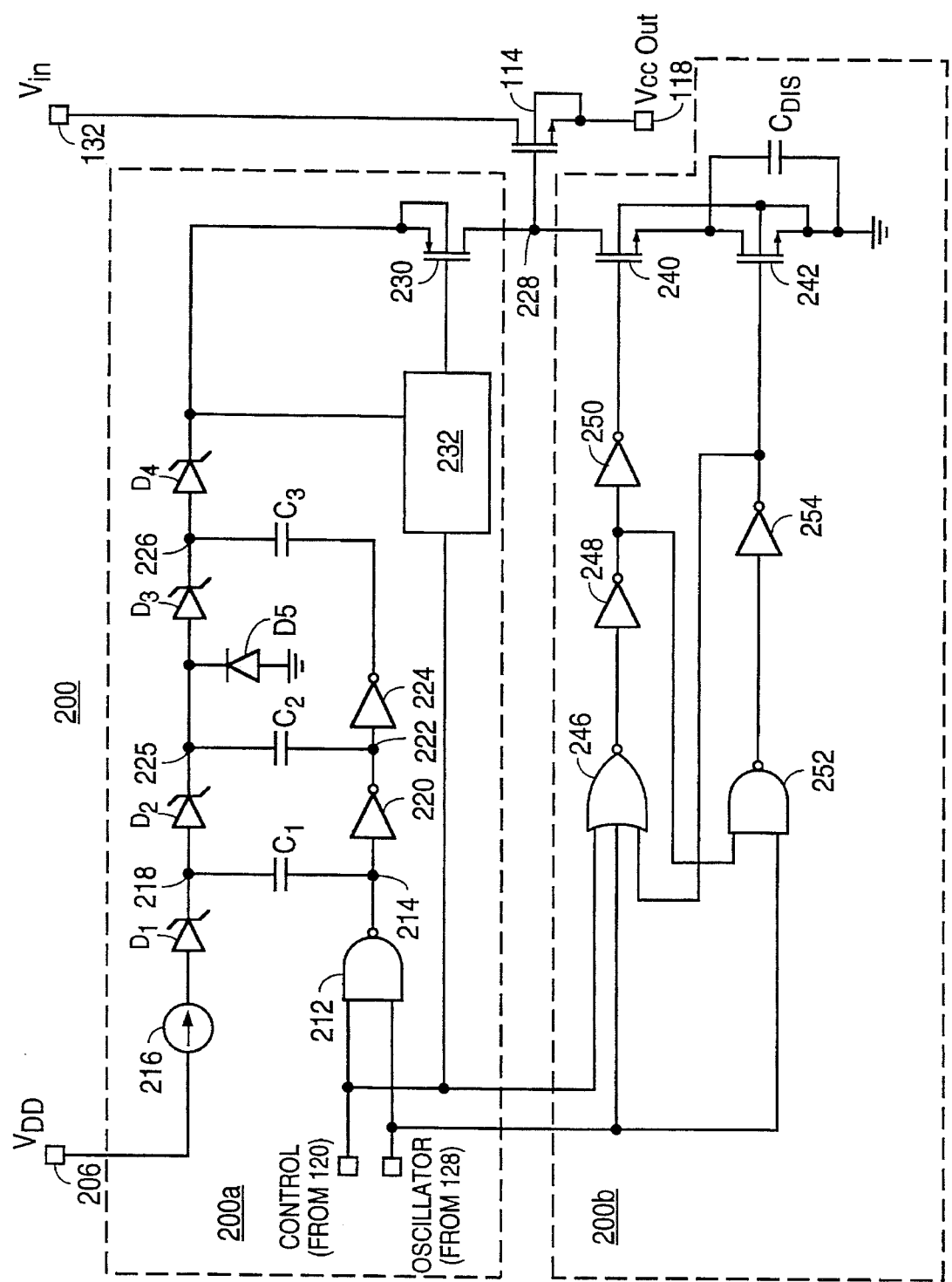
FIG. 2 is a schematic diagram of a portion of the power interface device of FIG. 1.

Referring also to FIG. 2, $V_{cc}$ control 112 includes circuit 200 for driving the gates of N-channel power MOSFET switches 114 and 116. For simplicity, the operation of circuit 200 will be discussed only with reference to switch 114. Circuit 200 includes a charge pump 200a and a discharge circuit 200b. Charge pump 200a incrementally charges the gate (i.e., increasing the gate-source capacitance by pulling up the gate) of N-channel switch 114, thereby gradually turning on switch 114. Discharge circuit 200b incrementally discharges the gate of switch 114, thereby gradually turning off switch 114.

A supply voltage $V_{DD}$ is provided to circuit 200 at terminal 206. A high control signal from logic circuit 120 (FIG. 1) is provided at an input of NAND gate 212 and at an input of NOR 246 to simultaneously enable charge pump 200a and disable discharge circuit 200b, respectively. This high signal is also simultaneously provided to level shift circuit 232, the function of which is described below. When oscillator 128 transitions high, NAND gate 212's output (node 214) goes low and allows current source 216 to charge capacitor $C_1$ to approximately $V_{DD}$ minus the voltage drop across Schottky diode $D_1$. Since Schottky diodes $D_1$–$D_4$ are identical devices, the voltage drop across each of Schottky diodes $D_1$–$D_4$ is equal to one another and will hereinafter be referred to as a "Schottky drop". On the following negative transition of oscillator 128, node 214 goes high to $V_{DD}$, thereby causing node 218 to approach $2 \times V_{DD}$ minus one Schottky drop. Node 222 is kept low by invertor 220, thereby allowing capacitor $C_1$ to charge capacitor $C_2$ to approximately $2 \times V_{DD}$ minus two Schottky drops. The next positive transition of oscillator 128 forces node 222 high to $V_{DD}$, thereby causing node 225 to approach approximately $3 \times V_{DD}$ minus two Schottky drops. Capacitor $C_2$ then charges capacitor $C_3$ to approximately $3 \times V_{DD}$ minus three Schottky drops. The next transition of oscillator 128 forces node 226 to approximately $4 \times V_{DD}$ minus three Schottky drops. Schottky diodes $D_1$–$D_4$ ensure that charge flows only towards the gate of switch 114.

Level shifter circuit 232 inverts the high control signal received from logic circuit 120 (FIG. 1) and provides a low signal to the gate of P-channel switch 230. In response thereto, switch 230 turns on and allows charge to flow from the cathode of diode $D_4$ to the gate of output switch 114, thereby incrementally charging the gate of output switch 114. As the voltage at the cathode of diode $D_4$ approaches its maximum value of approximately $4 \times V_{DD}$ minus four Schottky drops, the gate of switch 114 becomes fully charged and, accordingly, switch 114 is fully turned on. Level shifter circuit 232 may simply be an N-channel transistor having its source connected to ground and its drain connected to diode $D_4$ through a large resistor.

In the preferred embodiment, a clamp diode $D_5$ having a breakdown voltage of approximately 14.5 volts is coupled between node 225 and ground to clamp node 225 at approximately 14.5 volts. Capacitor $C_3$ will then charge to approximately $14.5 + V_{DD}$ volts. When output switch 104 is on, its source will have a voltage of approximately $V_{DD}$, thereby giving rise to a gate-source voltage of approximately 14.5 volts. By capping the gate-source voltage at approximately 14.5 volts, clamp diode $D_5$ postpones the time dependent breakdown of N-channel switch 114, i.e., prolongs the useful life of switch 114, while at the same time allowing for maximum gate enhancement of switch 114.

The gate of switch 114 has a charging rate controlled by the ratio of capacitances of capacitors $C_1$, $C_2$, $C_3$ and the gate of switch 114. This feature allows for the speed of switch 114's turn-on transitions to be accurately controlled. Providing small value capacitors $C_1$, $C_2$, $C_3$ with respect to the gate capacitance of switch 114 results in a relatively slow charging of the gate of switch 114, thereby causing switch 114 to have a relatively slow turn-on transition. This feature helps to minimize undesirable current spikes not only in switch 114 but also in any external devices connected to $V_{cc}$ pin 118 and input terminals 132 and 134. In the preferred embodiment, capacitors $C_1$, $C_2$, and $C_3$ are polysilicon MOS capacitors formed on-chip.

Applicant has found that where switch 114 has a gate capacitance of approximately 200 pF, choosing each of capacitors $C_1$, $C_2$, and $C_3$ to be approximately 5 pF results in switch 114 having a turn-on speed of approximately 10 ms with a 1 amp load.

During a $V_{cc}$ voltage transition, e.g., where PCMCIA card 138 requests interface device 100 to provide a new voltage at $V_{cc}$ pin 118, logic circuit 120 generates a low control signal which simultaneously disables charge pump 200a and enables discharge circuit 200b. This low control signal also turns off switch 230 via level shift circuit 232, thereby preventing additional charge flow into the gate of switch 114.

Discharge circuit 200b is driven by oscillator 128 (FIG. 1). On its low transition, oscillator 128 turns on switch 240 while simultaneously turning off switch 242. Charge flows from the gate of switch 114 through switch 240 and charges capacitor $C_{dis}$ which, in the preferred embodiment, is a polysilicon MOS capacitor. The next high transition of oscillator 128 turns off switch 240, preventing further discharge of switch 114's gate. Switch 242 simultaneously turns on and discharges capacitor $C_{dis}$. The next low transition of oscillator 128 further discharges the gate of switch 114 into capacitor $C_{dis}$, and so on, until the gate of switch 114 has been completely discharged. Incrementally discharging the gate of switch 114 in this manner, and thereby gradually turning off switch 114, further reduces the undesirable current spikes mentioned above.

Discharge circuit 200b operates as a break before make circuit to ensure that switches 240 and 242 are never simultaneously conductive. The feedback path from the output of invertor 248 to NAND 252 prevents switch 242 from turning on before switch 240 turns off, while the feedback path from invertor 254 to NOR 246 forces switch 240 to remain off until switch 242 turns off. This feedback prevents a short circuit between switch 114 and ground from quickly turning off switch 114.

The structure of discharge circuit 200b results in several advantages over conventional discharging techniques which use a discharge resistor. In such conventional techniques, the discharge rate of the gate of the switch is dependent upon the size of the discharge resistor, where slower turn-off speeds are realized by increasing the resistance (and thus the size) of the discharge resistor.

First, in accordance with the present invention, the discharge rate of switch 114's gate is controlled by the ratio of capacitances of capacitor $C_{dis}$ and the gate of MOS switch 114. Since capacitor $C_{dis}$ and switch 114 are both MOS structures virtually identical to one another, the turn-off speed of switch 114 may be controlled by selecting a particular ratio of the gate areas of MOS switch 114 and MOS capacitor $C_{dis}$. Controlling the turn-off speed of switch 114 by scaling the areas of similar structures with respect to one another is easier and more precise than varying the resistance of a leakage resistor. Thus, discharge circuit 200b allows the turn-off speed of switch 114 to be controlled with great precision even over wide temperature ranges.

Further, discharge circuit 200b is advantageous in conserving valuable die area. Switches 240 and 242 and their associated logic gates are minimum geometry devices requiring very little die area. As mentioned above, it is desirable to turn off switch 114 slowly in order to minimize undesirable current spikes. Decreasing the turn-off speed of switch 114 is realized by decreasing the size of capacitor $C_{dis}$, thereby also decreasing the size of discharge circuit 200b. Thus, undesirable current spikes may be minimized by reducing, rather than increasing, the die area of discharge circuit 200b. This advantageous feature makes PCMCIA power interface device 100 especially well suited for portable PCMCIA card applications.

Figure 3:
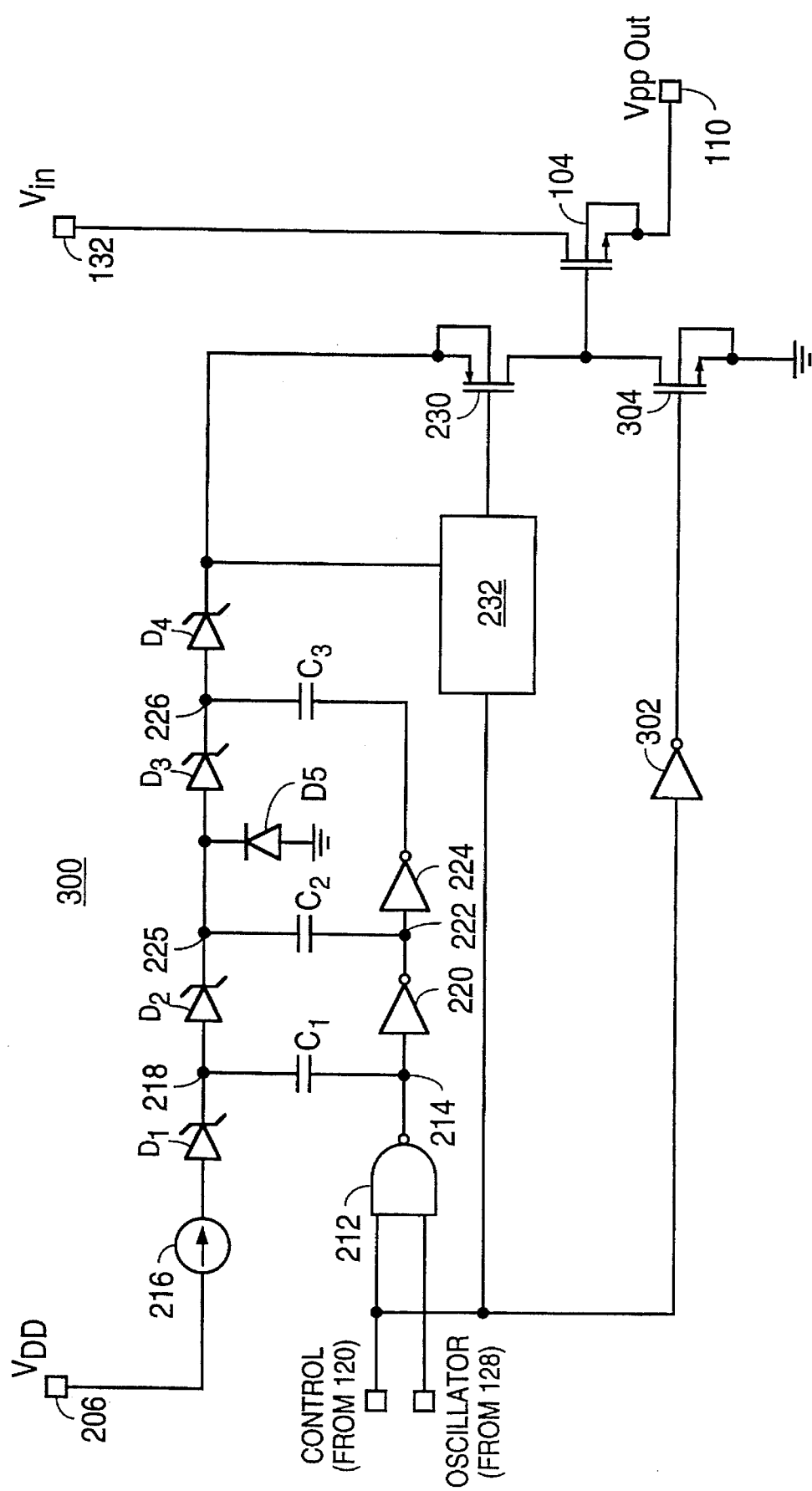
FIG. 3 is a schematic diagram of a charge pump in accordance with the present invention.
Figure 4:
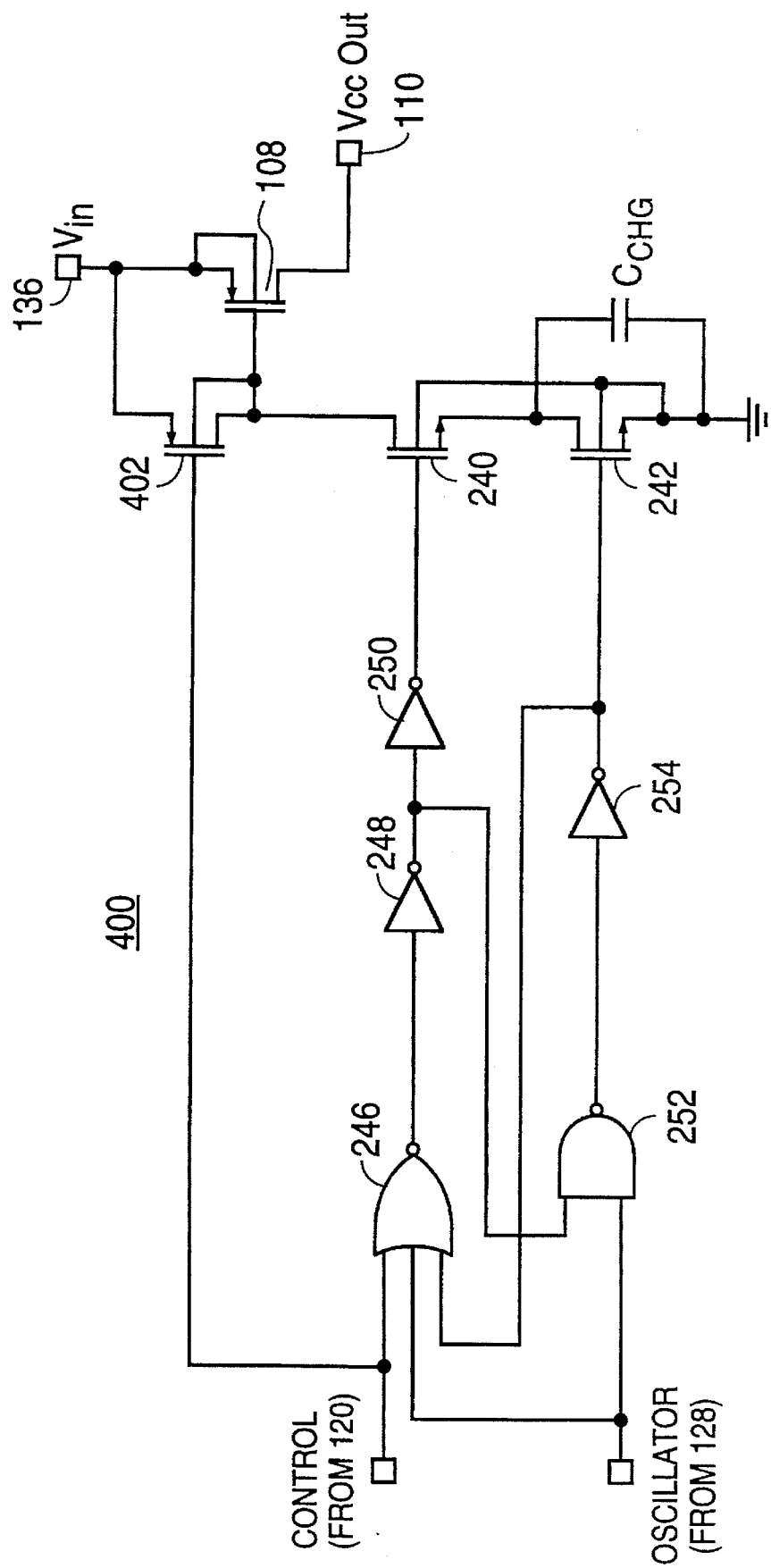
FIG. 4 is a schematic diagram of a discharge circuit in accordance with the present invention.

N-channel $V_{pp}$ switches 104 and 106 are significantly smaller than N-channel $V_{cc}$ switches 114 and 116. In order to match the turn-on speeds of $V_{pp}$ switches 104 and 106 with the turn-on speeds of $V_{cc}$ switches 114 and 116, a separate charge pump is used to drive $V_{pp}$ switches 104 and 106. Referring now to FIGS. 3 and 4, $V_{pp}$ control 102 (FIG. 1) includes a charge pump 300 for driving the gates of N-channel power MOSFET switches 104 and 106 and includes discharge circuit 400 for driving the gate of P-channel switch 108. For simplicity, charge pump 300 will be discussed only with reference to switch 104; the same charge pump 300 drives the gate of switch 106 using a switch (not shown) identical to switch 230.

Charge pump 300 is virtually identical to charge pump 200a of FIG. 2, where common components are labelled with the same symbols. The operation of charge pump 300 in turning on switch 104 is identical to that of charge pump 200a in turning on switches 114 and 116 and thus will not be discussed in detail herein. Like charge pump 200a, charge pump 300 allows the turn-on speeds of switch 104 to be controlled by manipulating the ratio of the capacitances of capacitors $C_1$, $C_2$, $C_3$ and the gate of switch 104. During $V_{pp}$ voltage transitions, charge pump 300 quickly (20–30 µs) turns off switch 104. A low control signal from logic circuit 120 (which prevents further charge flow into the gate of switch 104 via switch 230) is inverted to a high level by inverter 302 and turns on switch 304. Switch 304 quickly discharges the gate of switch 104, thereby quickly turning off switch 104.

Referring now to FIG. 4, switch 108 when turned on delivers power at 12 volts from terminal 136 to $V_{pp}$ pin 110. Since switch 108 is preferably a P-channel power MOSFET, a low gate-drive voltage is required to turn on switch 108. The operation of gate discharge circuit 400 is identical to and achieves all of the advantages of discharge circuit 200b (FIG. 2). Accordingly, common components are labelled with the same symbols. Discharge circuit 400 slowly turns on switch 108 by incrementally discharging the gate of switch 108 (i.e., increasing the gate-source voltage by pulling down the gate to ground). The discharge rate of switch 108, and thus the turn-on speed of switch 108, is controlled by the ratio of capacitances of $C_{chg}$ and the gate of switch 108. Controlling the turn-on speed of switch 108 by manipulating a capacitance ratio is advantageous since its turn-on speed may be easily and precisely controlled, as discussed above. Thus, P-channel $V_{pp}$ switch 108 is turned on and N-channel $V_{cc}$ switches 114 and 116 are turned off using identical discharge pumps, as described above. Switch 108 may be turned off quickly by P-channel MOSFET 402 or any other conventional pull-up means.

Figure 5:
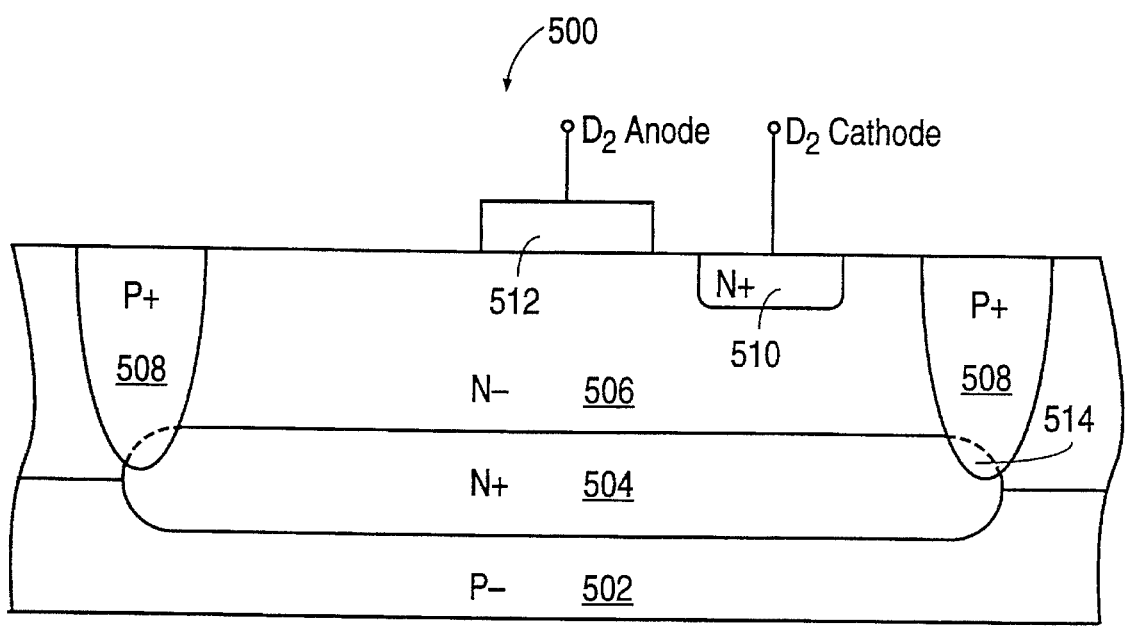
FIG. 5 is a cross-sectional view of a clamp diode in accordance with the present invention.

In another embodiment in accordance with the present invention, clamp diode $D_5$ of charge pump circuit 200a (FIG. 2) is integrated within the same epitaxial tub as is Schottky diode $D_2$ (FIG. 2). In a similar manner, clamp diode $D_5$ of charge pump circuit 300 (FIG. 3) may be integrated within the same epitaxial tub as is Schottky diode $D_2$ (FIG. 3). FIG. 5 shows structure 500 having a P– substrate 502, an N+ buried layer 504, an N– epitaxial layer 506, and P+ isolation regions 508. Epitaxial layer 506 has formed therein an N+ diffusion region 510. A metal layer 512 of Aluminum or some other metal having a P– type doping is provided over a portion of the top surface of epitaxial layer 506, thereby forming a Schottky junction between metal layer 512 and epitaxial layer 506.

Referring also to FIG. 2, metal layer 512 and N– epitaxial layer 506 serve as the anode and cathode, respectively, of Schottky diode $D_2$. N+ diffusion region serves as a surface contact for the cathode of Schottky diode $D_2$. The intersection of P+ isolation region 508 and N+ buried layer 504 forms a Zener junction 514, whereby P+ isolation region 508 and N+ buried layer 504 serve as the anode and cathode, respectively, of clamp diode $D_5$. Since both buried layer 504 and epitaxial layer 506 contact one another and are both N-type materials, the cathode of clamp diode $D_5$ and the cathode of Schottky diode $D_2$ are electrically connected. P+ isolation regions 508 electrically insulate clamp diode $D_5$ and Schottky diode $D_2$ from adjacent transistors (not shown).

While particular embodiments of the present invention have been shown and described, it will be obvious to those skilled in the art that changes and modifications may be made without departing from this invention in its broader aspects and, therefore, the appended claims are to encompass within their scope all such changes and modifications as fall within the true spirit and scope of this invention.

What is claimed is:

1. A method performed by a PCMCIA power interface device, said interface device including an N-channel MOSFET switching device having a first terminal connected to an output terminal of said interface device and having an on state and an off state, said method comprising the steps of:

(1) incrementally charging the gate of said switching device using a charge pump to gradually turn on said switching device;

(2) providing a voltage at an output terminal of said interface device, through said switching device, when said switching device is in said on state; and (3) incrementally discharging said gate of said switching device using a discharge circuit to gradually turn off said switching device, wherein said discharge circuit includes an MOS capacitor, wherein the rate of discharge of said gate of said switching device is proportional to the ratio of capacitances of said MOS capacitor and said gate such that the turn-off speed of said switching device is approximately proportional to said capacitance of said MOS capacitor, wherein step (3) further comprises the steps of:

(3a) sinking current from said gate of said switching device into said capacitor during a first interval of a clocking signal, said current simultaneously discharging said gate of said switching device and charging said capacitor by a predetermined amount of charge;

(3b) discharging said capacitor while preventing further discharge from said gate of said switching device during a second interval of said clocking signal; and (3c) repeating steps (3a) and (3b) until said switching device is in said off state.

2. A PCMCIA power interface device for providing a voltage to a PCMCIA card coupled to an output terminal of said interface device, said interface device comprising:

an N-channel MOSFET switching device having first and second terminals and a control terminal, said first terminal being coupled to receive said voltage, said second terminal being coupled to said output terminal;

a discharge circuit coupled to said gate of said switching device for turning off said switching device, said discharge circuit including a capacitor for incrementally discharging said gate of said switching device and further comprising:

a first transistor having a source, a gate, and a drain, said drain being coupled to said gate of said switching device, said source being coupled to a first terminal of said capacitor;

a second transistor having a source, a gate, and a drain, said drain being coupled to said source of said first transistor, said source being coupled to a second terminal of said capacitor and to a first potential; and a logic circuit coupled to said gates of said first and second transistors, said logic circuit controlling the on and off states of said first and second transistors such that said capacitor incrementally discharges said gate of said switching device from so as to turn said switching transistor;

a charge pump coupled to said gate of said switching device, said charge pump comprising a plurality of parallel-connected capacitors for incrementally charging said gate of said switching device such that said switching device gradually turns on, wherein the charging rate of said gate of said switching device is proportional to the ratio of capacitances of said plurality of capacitors and said gate of said switching device;

a plurality of Schottky diodes, wherein each of said plurality of Schottky diodes is connected between an associated two of said parallel-connected capacitors; and a clamp diode coupled between a cathode of one of said plurality of Schottky diodes and a second potential, said clamp diode comprising:

a semiconductor substrate of a first conductivity type having formed on a portion thereof a buried layer of a second conductivity type;

an epitaxial layer of said second conductivity type overlying said buried layer and said substrate; and an isolation region of said first conductivity type extending from a top surface of said epitaxial layer and contacting said buried layer, wherein said isolation region and said buried layer serve as an anode and a cathode of said clamp diode, respectively, said epitaxial layer having formed on a portion thereof a metal layer serving as an anode of said Schottky diode, said epitaxial layer serving as said cathode of said Schottky diode.

3. The structure of claim 2, wherein said metal layer comprises Aluminum.

4. The structure of claim 2, wherein said second potential is ground potential.

* * * * *